US012650345B1

(12) United States Patent (10) Patent No.: US 12,650,345 B1
Kuzi et al. (45) Date of Patent: Jun. 9, 2026

(54) DYNAMIC TEMPERATURE SENSING CADENCE

(71) Applicant: Apple Inc., Cupertino, CA (US)

(72) Inventors: Tal Kuzi, Tel Aviv (IL); Achmed R. Zahir, Menlo Park, CA (US); Alexander Sudakov, Oranit (IL); Bruno W. Garlepp, Sunnyvale, CA (US); Doron Rajwan, Rishon LeZion (IL); Inder M. Sodhi, Palo Alto, CA (US); Jafar Savoj, Sunnyvale, CA (US); Jung Wook Cho, Cupertino, CA (US); Pavithra Souriraj, San Jose, CA (US)

(73) Assignee: Apple Inc., Cupertino, CA (US)

( * ) Notice: Subject to any disclaimer, the term of this patent is extended or adjusted under 35 U.S.C. 154(b) by 758 days.

(21) Appl. No.: 18/054,096

(22) Filed: Nov. 9, 2022

Related U.S. Application Data

(60) Provisional application No. 63/374,120, filed on Aug. 31, 2022.

(51) Int. Cl.
G01K 3/10 (2006.01)
G01K 3/14 (2006.01)
(Continued)

(52) U.S. Cl.
CPC ................ G01K 3/10 (2013.01); G01K 3/14 (2013.01); G06F 11/3058 (2013.01);
(Continued)

(58) Field of Classification Search
CPC ........ G01K 3/10; G01K 3/14; G06F 11/3058; G06F 1/3206; G06F 11/002;
(Continued)

(56) References Cited

U.S. PATENT DOCUMENTS 5,590,061 A * 12/1996 Hollowell, II .......... G06F 1/206
714/24
6,557,072 B2 * 4/2003 Osborn ................... G06F 1/206
365/222

(Continued)

*Primary Examiner* — Laura Martin
*Assistant Examiner* — Philip L Cotey
(74) *Attorney, Agent, or Firm* — Kowert, Hood, Munyon, Rankin & Goetzel, P.C.; Scott W. Pape; Dean M. Munyon

(57) ABSTRACT

An integrated circuit includes a plurality of temperature sensor circuits, placed in respective locations distributed across the integrated circuit, and a control circuit. Ones of the plurality of temperature sensor circuits may be configured to produce respective sets of temperature samples indicating an operating temperature of a respective region of the integrated circuit. The control circuit may be configured to sample, using a particular sample rate, respective temperature samples from a subset of the plurality of temperature sensor circuits. The control circuit may be further configured to determine a particular temperature estimate using one or more of the temperature samples and an operating mode of a functional circuit within the respective regions of the subset of temperature sensors. In response to a determination that the particular temperature estimate satisfies a threshold value, the control circuit may be configured to adjust the particular sample rate for subsequent temperature samples.

20 Claims, 9 Drawing Sheets

(51) Int. Cl.

| | |
|---|---|
| *G06F 11/30* | (2006.01) |
| *G06F 1/3206* | (2019.01) |
| *G06F 11/00* | (2006.01) |
| *H05K 7/20* | (2006.01) |
| *H10W 40/00* | (2026.01) |

(52) U.S. Cl.
CPC ............... *G05B 2219/21156* (2013.01); *G05B 2219/24205* (2013.01); *G06F 1/3206* (2013.01); *G06F 11/002* (2013.01); *H05K 7/20* (2013.01); *H10W 40/00* (2026.01)

(58) Field of Classification Search
CPC .......... G05B 2219/21156; G05B 2219/24205; H01L 23/34; H05K 7/20
See application file for complete search history.

(56) References Cited

U.S. PATENT DOCUMENTS

| | | | | |
|---|---|---|---|---|
| 8,096,705 | B2 * | 1/2012 | Sri-Jayantha | G06F 1/206 |
| | | | | 374/111 |
| 8,182,141 | B1 * | 5/2012 | Collins | G01K 11/22 |
| | | | | 374/119 |
| 9,360,907 | B2 * | 6/2016 | Doshi | G06F 1/324 |
| 10,416,737 | B2 * | 9/2019 | Chandra | G06F 1/206 |
| 12,055,988 | B1 * | 8/2024 | Nikafrooz | G06F 1/206 |
| 2005/0099163 | A1 * | 5/2005 | Liepold | G01K 17/06 |
| | | | | 374/E17.007 |
| 2015/0169016 | A1 * | 6/2015 | Doshi | G06F 11/3031 |
| | | | | 713/320 |
| 2016/0124475 | A1 * | 5/2016 | Chandra | G06F 1/206 |
| | | | | 700/300 |
| 2016/0265982 | A1 * | 9/2016 | Bachand | G01K 3/00 |
| 2017/0168532 | A1 * | 6/2017 | Kim | G06F 1/206 |
| 2022/0124616 | A1 * | 4/2022 | Yu | H04W 52/0225 |
| 2022/0136909 | A1 * | 5/2022 | Kim | G01K 7/425 |
| | | | | 702/136 |

* cited by examiner

<u>500</u>

Sampling, using a particular sample rate, a subset of a plurality of temperature sensor circuits to generate a set of temperature samples, wherein the plurality of temperature sensor circuits are distributed across an integrated circuit.
<u>510</u>

Determining, using the set of temperature samples and an operating mode of a particular functional circuit on the integrated circuit, a particular temperature estimate indicative of a temperature of the particular functional circuit.
<u>520</u>

Determining, using the particular temperature estimate, whether to adjust a sample rate for subsequent samples.
<u>530</u>

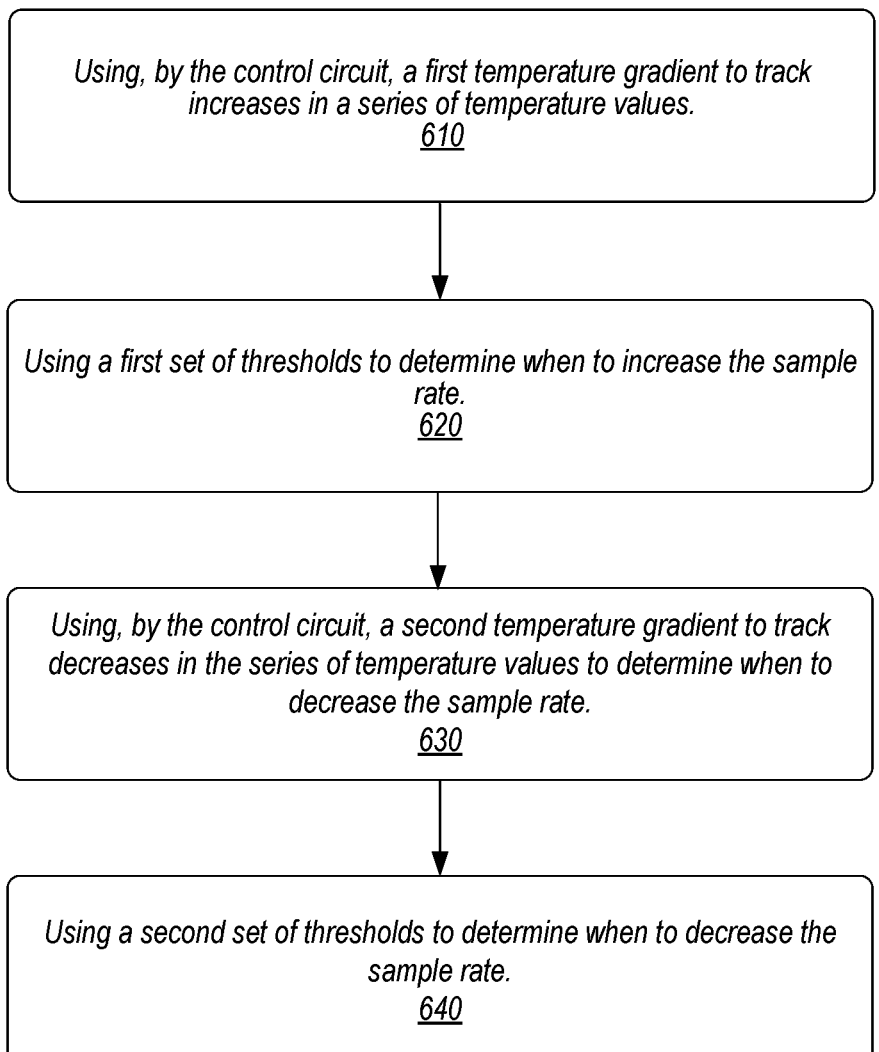

*Using, by the control circuit, a first temperature gradient to track increases in a series of temperature values.*
<u>610</u>

*Using a first set of thresholds to determine when to increase the sample rate.*
<u>620</u>

*Using, by the control circuit, a second temperature gradient to track decreases in the series of temperature values to determine when to decrease the sample rate.*
<u>630</u>

*Using a second set of thresholds to determine when to decrease the sample rate.*
<u>640</u>

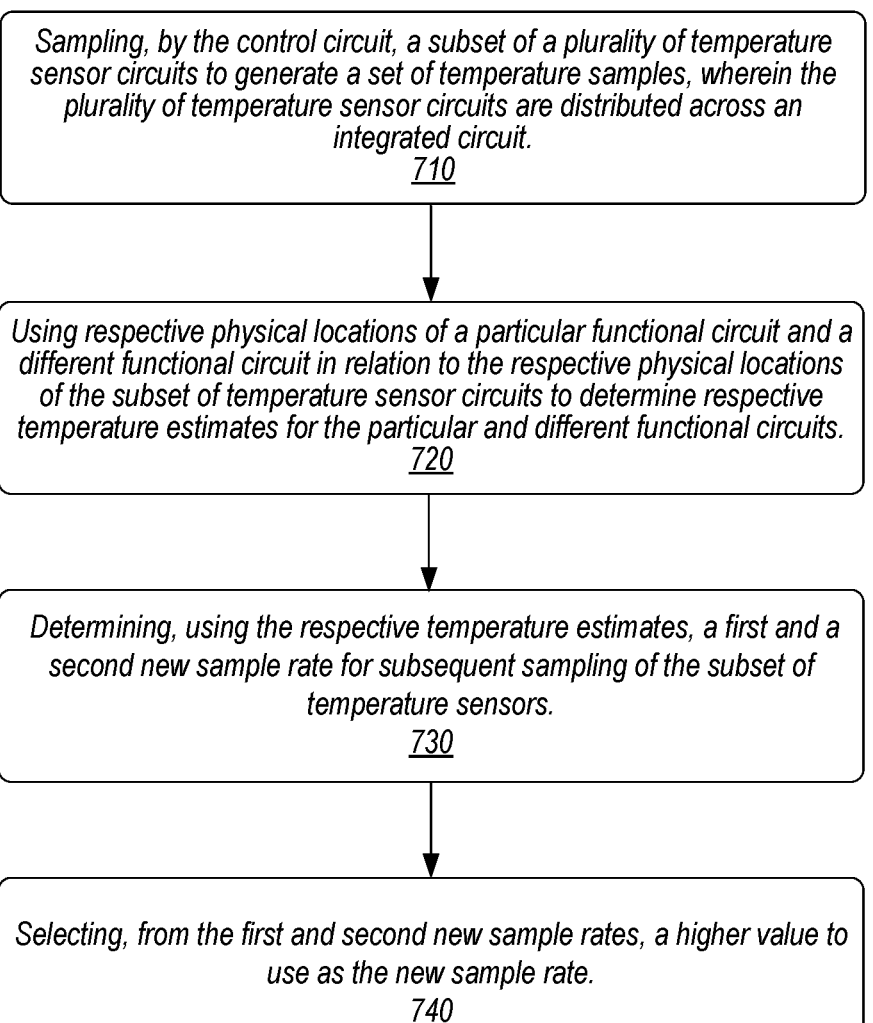

Sampling, by the control circuit, a subset of a plurality of temperature sensor circuits to generate a set of temperature samples, wherein the plurality of temperature sensor circuits are distributed across an integrated circuit.
<u>710</u>

Using respective physical locations of a particular functional circuit and a different functional circuit in relation to the respective physical locations of the subset of temperature sensor circuits to determine respective temperature estimates for the particular and different functional circuits.
<u>720</u>

Determining, using the respective temperature estimates, a first and a second new sample rate for subsequent sampling of the subset of temperature sensors.
<u>730</u>

Selecting, from the first and second new sample rates, a higher value to use as the new sample rate.
<u>740</u>

*FIG. 7*

DYNAMIC TEMPERATURE SENSING CADENCE

PRIORITY CLAIM

The present application claims the benefit of U.S. Provisional Patent Application No. 63/374,120, filed on Aug. 31, 2022, and whose disclosure is incorporated herein by reference.

BACKGROUND

Technical Field

Embodiments described herein are related to computing systems, including systems-on-a-chip (SoCs). More particularly, embodiments are disclosed to techniques for determining temperatures of circuits on an SoC.

Description of the Related Art

Integrated circuit (IC) design, including system-on-a-chip (SoC) design, may include millions, or even billions, of transistors packed tightly onto a single semiconductor chip to form various functional circuits. Performance characteristics of the transistors and other circuit elements, such as resistors and capacitors, that are included in a given functional circuit may vary across temperature. For example, as temperature rises, a speed at which a transistor transitions between on and off states may increase, a resistance of a resistor may increase, and a capacitance of a capacitor may decrease. Accordingly, functionality of circuits comprising these circuit elements may change as temperature changes. Generally speaking, a functional circuit in an IC is designed to operate within a particular temperature range. As an operating temperature approaches a threshold of the designed range, operational parameters of the functional circuit (e.g., a voltage level, and/or a frequency of a clock source) may be changed to compensate for the temperature change.

Failure to keep operational parameters of a functional circuit within design limits may result in the functional circuit operating in an unpredictable manner, thereby resulting in improper operation. Such improper operation may result in frustration for a legitimate user of a device that utilizes ICs. and in some applications, can present a safety issue. In addition, a hacker may attempt to utilize temperature extremes to force a security feature of a device to malfunction, possibly allowing unauthorized access to the device.

BRIEF DESCRIPTION OF THE DRAWINGS

The following detailed description makes reference to the accompanying drawings, which are now briefly described.

FIG. 5 shows a flow diagram of an embodiment of a method for determining a rate for sampling temperature sensors.

FIG. 6 depicts a flow diagram of an embodiment of a method for using series of temperature values for determining when to increase or decrease a sample rate.

FIG. 7 illustrates a flow diagram of an embodiment of a method for using physical locations of temperature sensors and functional circuits for estimating respective temperatures of the functional circuits.

Figure 1:
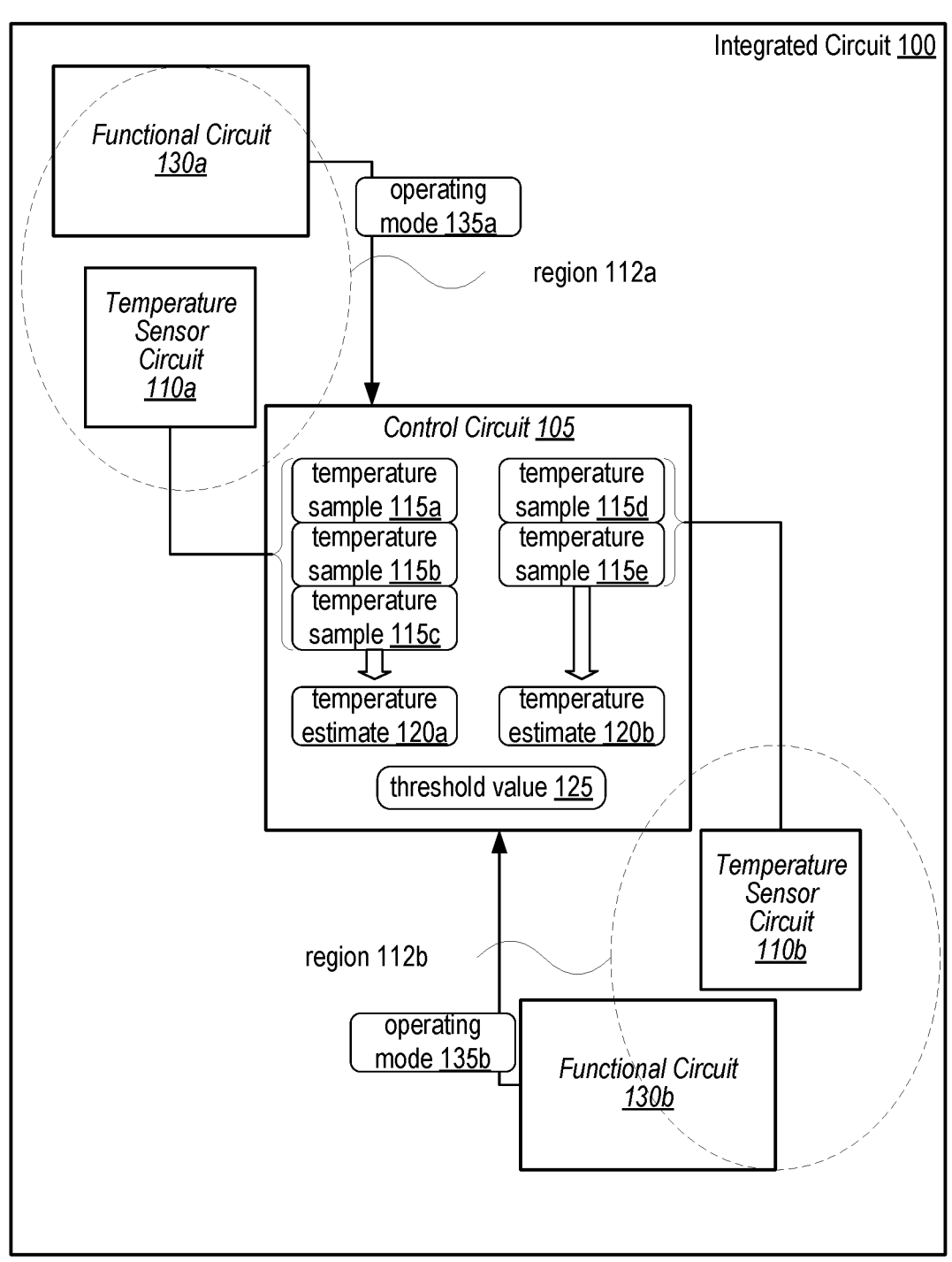
FIG. 1 illustrates a block diagram of an embodiment of an integrated circuit that includes a plurality of functional circuits, temperature sensor circuits and a control circuit.

While embodiments described in this disclosure may be susceptible to various modifications and alternative forms, specific embodiments thereof are shown by way of example in the drawings and will herein be described in detail. It should be understood, however, that the drawings and detailed description thereto are not intended to limit the embodiments to the particular form disclosed, but on the contrary, the intention is to cover all modifications, equivalents and alternatives falling within the spirit and scope of the appended claims.

DETAILED DESCRIPTION OF EMBODIMENTS

To track operating temperatures of circuits, an integrated circuit (IC) may contain one or more temperature sensing circuits that can be sampled periodically and used to determine whether operating parameters for functional circuits should be adjusted to avoid operating the functional circuits at or beyond their design limits. The action of enabling a temperature sensor, generating a temperature sample, and evaluating the sample to determine where in the operating range the IC is currently located, consumes power and, therefore, generates additional heat. Depending on a number of temperature sensors in an IC and a rate for sampling these sensors, a non-trivial amount of power may be consumed, and a corresponding amount of heat generated.

For example, a given system-on-a-chip (SoC) may have two temperature sensors per processor core, with eight or more cores located throughout the SoC. Sampling sixteen or more temperature sensors, five or more times a second may consume multiple milliwatts of power every second. One hour of operation might consume a Joule or more of energy just for temperature monitoring.

The present disclosure considers novel digital circuits for use in ICs to adjust a rate for sampling at least a portion of temperature sensor circuits in the IC. For example, a plurality of temperature sensor circuits may be placed in respective locations distributed across an IC. A given temperature sensor circuit, when enabled, may be configured to produce one or more temperature samples that provide an indication of an operating temperature of a respective region of the IC. This IC may also include a control circuit that is configured to sample, using a particular sample rate, respective temperature samples from a subset of the temperature sensor circuits. The control circuit may also receive an indication of an operating mode of a functional circuit that is physically located within the respective regions of the subset of temperature sensors. Using one or more of the temperature samples and the operating mode, the control circuit may be capable of determining a particular temperature estimate for the functional circuit. Based on the estimated temperature, the control circuit may be configured to adjust the sample rate for subsequent temperature samples.

By using the temperature estimate to adjust the sensor sampling rate, fewer samples may be collected while the temperature is within a safe operating region, and then increase the sample rate as subsequent temperature estimates approach a threshold temperature that is indicative of an operational limit. For example, as temperature rises, the sampling rate may increase as the temperature of a functional circuit approaches an upper limit. The increased sampling rate as the limit is approached may help to avoid temperatures exceeding the limit. An operating voltage level and/or a clock signal frequency for the functional circuit may be reduced as temperature increases, thereby reducing a power consumption of the functional circuit, and consequently stabilizing or reducing the temperature of the functional circuit. Once the temperature falls back into a safe region, the sampling rate for the temperature sensors may be reduced, thereby conserving power and reducing an amount of heat contributed by the temperature monitoring.

FIG. 1 illustrates a block diagram of an embodiment of an IC that includes temperature sensors that can be sampled using an adjustable sampling rate. As illustrated, integrated circuit 100 includes control circuit 105, temperature sensor circuits 110a and 110b (collectively 110), and functional circuits 130a and 130b (collectively 130). Each of temperature sensor circuits 110 is capable of producing an indication of a temperature of a physical region (regions 112a and 112b, collectively 112) on integrated circuit 100. In some embodiments, integrated circuit 100 may be a part of a computing system, such as a desktop or laptop computer, a smartphone, a tablet computer, a wearable smart device, or the like.

As illustrated, temperature sensor circuits 110 are placed in respective locations distributed across integrated circuit 100. Although only two temperature sensor circuits 110 are depicted, additional temperature sensor circuits may be included at various other locations across integrated circuit 100. Temperature sensor circuits 110 are configured to produce respective sets of temperature samples indicating an operating temperature of a respective region 112 of the integrated circuit. Temperature sensor circuit 110a produces an indication of a temperature of region 112a, while temperature sensor circuit 110b similarly produces an indication of a temperature of region 112b. In some embodiments, temperature sensor circuits 110 may each generate corresponding digital values that are indicative of a temperature of the respective region 112. For example, each temperature sensor circuit 110 may, when enabled, generate a binary value from 0b00000000 (indicative of a minimum measurable temperature) to 0b11111111 (indicative of a maximum measurable temperature). In other embodiments, temperature sensor circuits 110 may generate an analog signal that is indicative of the respective regional temperature. For example, each of temperature sensor circuits 110 may generate a voltage level from zero volts (minimum measurable temperature) to one volt (maximum measurable temperature). In such embodiments, control circuit 105 may include or have access to an analog-to-digital converter circuit for converting the analog voltage into a digital value.

Control circuit 105, as shown, is configured to sample, using a particular sample rate, respective temperature samples from temperature sensor circuits 110. Temperature samples 115a-115c are received from temperature sensor circuit 110a, while temperature samples 115d and 115e are received from temperature sensor circuit 110b. Fewer temperature samples 115 may be received from temperature sensor circuit 110b due to, for example, control circuit 105 using a slower sampling rate for temperature sensor circuit 110b than for temperature sensor circuit 110a. In various embodiments, control circuit 105 may have dedicated hard-wired interfaces to each temperature sensor circuit 110, or may utilize a communication bus available to a variety of circuits on integrated circuit 100. In some embodiments, control circuit 105 may utilize a dedicated bus for communicating to a plurality of temperature sensor circuits on integrated circuit 100.

As shown, control circuit 105 is also configured to determine a particular temperature estimate 120 using one or more of the temperature samples 115 and an operating mode of a respective one of functional circuits 130 within the respective regions 112 of temperature sensor circuits 110. For example, control circuit 105 determines temperature estimate 120 using at least one of temperature samples 115a-115c, as well as operating mode 135a. Operating mode 135a may include one or more indications of an activity level of functional circuit 130a. For example, operating mode 135a may include indications of a functional mode or power state of functional circuit 130a (e.g., a power-gated mode, a reduced-power mode, a full-power mode, a standby mode, and the like). Operating mode 135a may include current operating parameters for functional circuit 130a, such as an operating voltage level, a frequency of an associated clock signal, and so forth. In some embodiments, operating mode 135a may indicate whether a power and/or clock signal supplied to functional circuit 130a is gated. In further embodiments, operating mode 135a may include an indication of a current workload. For example, if functional circuit 130a is a processor core, or an execution unit or co-processor in a processor core, then a current workload may be indicated as a number of commands waiting in a queue to be processed by functional circuit 130a, or as a current command retirement rate indicative of a number of commands retired over a recent time period. In various embodiments, operating modes 135a and 135b may be provided by functional circuits 130, respectively, and/or by a power management circuit (not shown) included in integrated circuit 100 or in a different integrated circuit coupled to integrated circuit 100.

Temperature estimate 120a may be generated to estimate a temperature of functional circuit 130a by averaging two or more of temperature samples 115a-115c. This average temperature value may then be adjusted based on the operating mode 135a. If operating mode 135a is indicative of a high level of activity and/or a high power consumption by functional circuit 130a, then temperature estimate 120a may be increased, assuming that functional circuit 130a is responsible for a large portion of the heat generated in region 112a. In contrast, if operating mode 135a indicates low activity and/or power consumption by functional circuit 130a, then temperature estimate 120a may be adjusted lower, based on an assumption that other circuits within region 112a are responsible for a majority of the heat generated in region 112a. Control circuit 105 is similarly configured to determine temperature estimate 120b for functional circuit 130b using temperature samples 115d and 115e, and adjusting based on operating mode 135b.

As illustrated, after temperature estimates 120a and 120b are generated, control circuit 105 compares the respective temperature estimates 120 to one or more threshold values, such as threshold value 125. For example, in response to a determination that temperature estimate 120a satisfies threshold value 125 (e.g., is equal to or greater), control circuit 105 may adjust the particular sample rate for collecting subsequent temperature samples from temperature sensor circuit 110*a*. Threshold value 125 may, in some embodiments, indicate a temperature value that is approaching an upper operating temperature limit for functional circuit 130*a*. Accordingly, the particular sample rate for use with temperature sensor circuit 110*a* may be increased, thereby reducing an amount of time until a next set of temperature samples are collected from temperature sensor circuit 110*a*. Similarly, temperature estimate 120*b* may be compared to threshold value 125 to make a similar decision for adjusting a sample rate for subsequent samples of temperature sensor circuit 110*b*.

In addition, temperature estimates 120*a* and 120*b* may be used to determine whether operating parameters for functional circuits 130*a* and 130*b*, respectively, are to be altered. For example, if temperature estimate 120*a* satisfies threshold value 125 while temperature estimate 120*b* does not, then control circuit 105 may cause adjustments to be made to the operating parameters for functional circuit 130*a* in order to cause the temperature in region 112*a* to fall. In contrast, operating parameters for functional circuit 130*b* may remain in their current state, or in some cases, may be allowed to be adjusted to increase activity by functional circuit 130*b*. For example, if the operating parameters for functional circuit 130*b* had previously been adjusted to reduce temperature in region 112*b*, then a reduced value of temperature estimate 120*b* may indicate that the temperature in region 112*b* has fallen enough to allow functional circuit 130*b* to increase activity.

By adjusting the sample rates for temperature sensors based on current estimated temperature levels, power consumption may be reduced during times when temperature levels are not close to operating limits. As a temperature level increases in a particular region, temperature sensors associated with that region may be sampled more frequently to more closely track if the temperature is approaching the operating limit. Meanwhile, temperature sensors in other regions that are not nearing the operating limit may continue to be sampled at lower rates to reduce power. This regional use of temperature estimates may reduce more power than if all temperature sensors on the integrated circuit are sampled at a same sample rate.

It is noted that integrated circuit 100, as illustrated in FIG. 1, is merely an example. Integrated circuit 100 has been simplified to highlight features relevant to this disclosure. Elements not used to describe the details of the disclosed concepts have been omitted. For example, integrated circuit 100 may include various additional circuits that are not illustrated, such as one or more power management circuits, clock management circuits, communication busses and bus controllers, and the like. Although two functional circuits 130 and two temperature sensor circuits 110 are shown, any suitable number of these circuits may be included. In various embodiments, control circuit 105, functional circuits 130, and other circuits of integrated circuit 100 may be implemented using any suitable combination of sequential and combinatorial logic circuits. In addition, register and/or memory circuits, such as static random-access memory (SRAM) may be used in these circuits to temporarily hold information such as instructions, fetch parameters, and/or address values.

In FIG. 1, a respective temperature sensor circuit is shown for a corresponding functional circuit. In other embodiments, temperature sensor circuits may be arranged on an integrated circuit such that their respective regions may overlap. Temperature samples from a plurality of temperature sensor circuits may be used to estimate a temperature of more than one functional circuit. An example of an integrated circuit with a plurality of functional circuits located in overlapping regions is depicted in FIG. 2.

Figure 2:
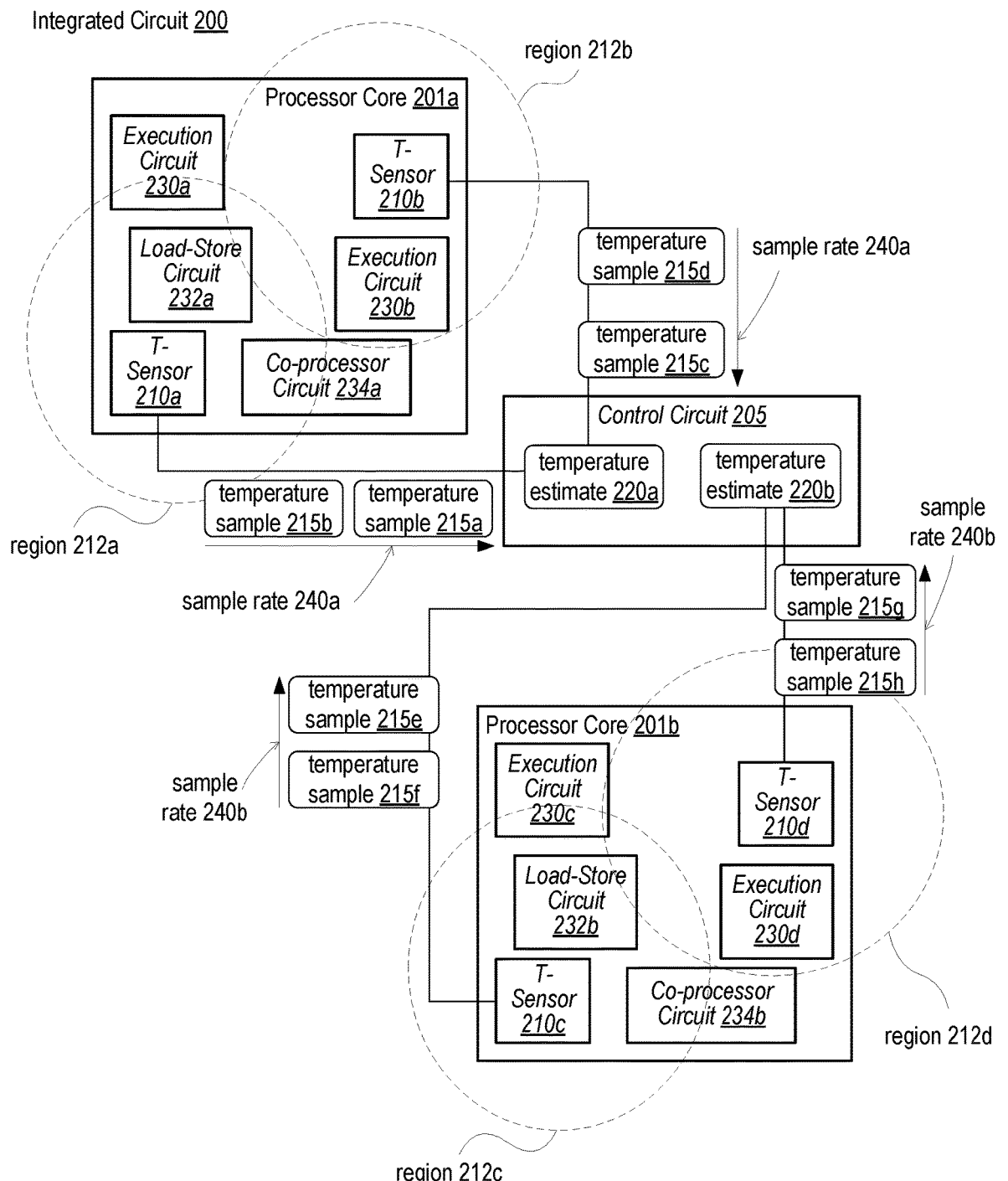
FIG. 2 shows a block diagram of an embodiment of an integrated circuit that includes a plurality of processor cores, the processor cores including a plurality of functional circuits and temperature sensor circuits.

Moving to FIG. 2, a block diagram of an embodiment of an integrated circuit with a control circuit for monitoring a plurality of temperature sensor circuits across multiple processor cores is shown. Integrated circuit 200 includes processor cores 201*a* and 201*b* (collectively 201), control circuit 205, and temperature sensor circuits (T-sensors) 210*a*-210*d* (collectively 210) distributed among processor cores 201. In similar manner as described above for FIG. 1, each of temperature sensor circuits 210 is capable of producing an indication of a temperature of a physical region (regions 212*a*-212*d*, collectively 212) on integrated circuit 200. As depicted, some regions 212 may overlap, at least in part, with other regions 212. Integrated circuit 200, like integrated circuit 100, may be a part of a computing system, such as a desktop or laptop computer, a smartphone, a tablet computer, a wearable smart device, or the like.

In various embodiments, processor cores 201 may be different instances of a same processor core design or different processor core designs. At various points in time, processor cores 201 may, independently, be operating in any one of a plurality of operating modes to support functions of a larger system in which integrated circuit 200 is included. As shown, each of processor cores 201 includes a respective set of circuits, such as a pair of execution circuits 230, load-store circuit 232, and co-processor circuit 234. In addition, temperature sensor circuits 210*a* and 210*b* are distributed in processor core 201*a*, while temperature sensor circuits 210*c* and 210*d* are located within processor core 201*b*. During operation, chip temperatures measurable by each of temperature sensor circuits 210 may vary depending on a variety of conditions including, for example, the operating mode of a respective processor core 201, instruction code being executed in the respective processor core 201, activity of the various circuits within the respective processor core 201, operating voltage levels and clock signal frequencies supplied to the respective processor core 201.

As illustrated, control circuit 205 is configured is to collect temperature samples 215*a*-215*d* from temperature sensor circuits 210*a* and 210*b*, using a first sample rate 240*a*. Temperature sensor circuits 210*a* and 210*b*, as depicted, are associated with processor core 201*a*. Temperature sensor circuits 210*a* and 210*b* are distributed among the functional circuits included within processor core 201*a*, including execution circuits 230*a* and 230*b*, load-store circuit 232*a*, and co-processor circuit 234*a*.

Control circuit 205, as shown, is further configured to determine temperature estimate 220*a* using the collected temperature samples 215*a*-215*d* from temperature sensor circuits 210*a* and 210*b*. Temperature estimate 220*a* may be indicative of a temperature of processor core 201*a*. In other embodiments, temperature estimate 220*a* may be indicative of a temperature of one of the circuits within processor core 201*a*, such as execution circuit 230*a*. In such embodiments, control circuit 205 may be configured to use temperature samples 215*a*-215*d* to determine a respective temperature estimate for two or more of the circuits included in processor core 201*a*. For example, temperature estimate 220*a* may correspond to a temperature of execution circuit 230*a* while a different temperature estimate (not illustrated) may correspond to a temperature of co-processor circuit 234*a*. A physical distance from each of execution circuit 230*a* and co-processor circuit 234*a* to temperature sensor circuits 210*a* and 210*b* may be used when determining the respective temperature estimates.

As depicted, control circuit 205 is also configured to determine, using temperature estimate 220a, whether to select a second sample rate for collecting subsequent temperature samples. Similar to the description in FIG. 1, sample rate 240a for collecting temperature samples from temperature sensor circuits 210a and 210b may be increased or decreased based on a current temperature of processor core 201a. For example, if temperature estimate 220a is less than a particular threshold value, then sample rate 240a may be used, while a temperature estimate greater than the particular threshold value may result in use of sample rate 240b. Sample rate 240b may be higher than sample rate 240a, resulting in more temperature samples being collected within a particular period of time. This higher sample rate may enable more frequent and/or more accurate estimates of the temperature of processor core 201a. In contrast, use of the lower sample rate 240a may reduce an amount of time during which temperature sensor circuits 210a and 210b are active, thereby reducing an amount of power consumed (and consequently an amount of heat generated) for collecting temperature samples.

Control circuit 205, as illustrated, is also configured to sample, using sample rate 240b, temperature samples 215e-215h from temperature sensor circuits 210c and 210d. Temperature sensor circuits 210c and 210 are associated processor core 201b, rather than processor core 201a. Control circuit 205 is further configured to determine, using temperature samples 215e-215h collected from temperature sensor circuits 210c and 210d, temperature estimate 220b (different from temperature estimate 220a) indicative of a temperature of processor core 201b. Accordingly, if processor core 201b is more active than processor core 201a at a particular point in time (e.g., a compute-intensive task has been assigned to processor core 201b while processor core 201a may be in a standby mode or performing a task that results in many idle cycles), then control circuit 205 may use a higher sample rate 240b to closely monitor a temperature of the active processor core 201b while using a lower sample rate 240a to monitor the less active processor core 201a. Power may be conserved by allowing processor core 201a to be monitored with the slower sample rate as compared to sampling all temperature sensor circuits 210 on integrated circuit 200 with a same sample rate.

It is noted that the example shown in FIG. 2 is associated with one depiction of an integrated circuit with a plurality of processor cores and a control circuit that enables independent monitoring of a temperature of each processor core. Although the various circuits are illustrated using varying sizes of rectangles, actual integrated circuit design may result in the circuit elements (e.g., logic gates) for these circuits being placed in a manner resulting in various random shapes and sizes. Locations of temperature sensor circuits relative to the various circuits of the integrated may be determined after a place and route design step has completed.

In FIG. 2, the control circuit is described as estimating temperatures using respective temperature samples from a subset of temperature sensor circuits. Temperature estimates may be determined using a variety of techniques. Additional details of how a temperature may be estimated is shown in FIG. 3.

Figure 3:
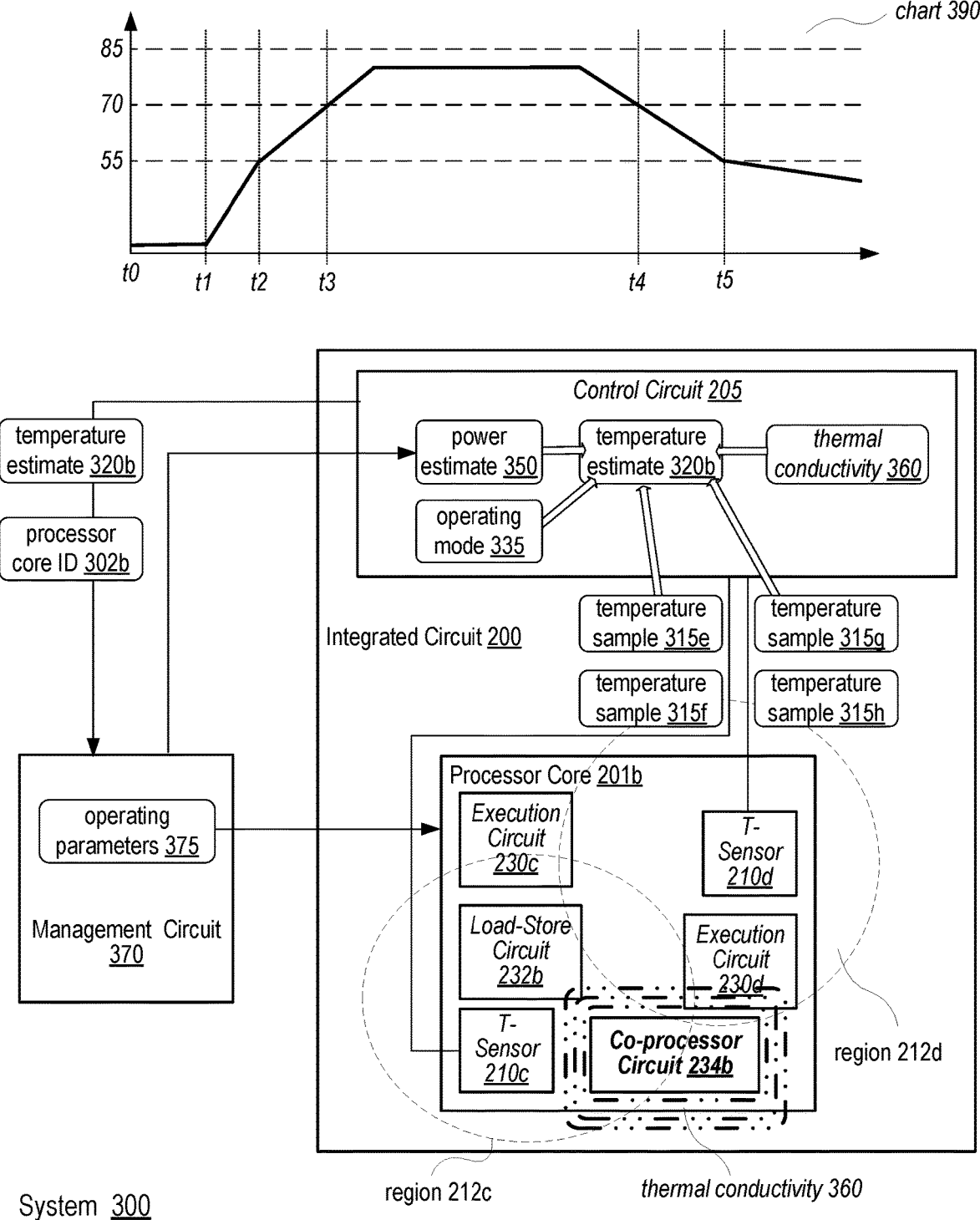
FIG. 3 depicts a block diagram of an embodiment of an integrated circuit coupled to a management circuit, as well as a chart illustrating a temperature in the integrated circuit versus time.

Turning to FIG. 3, a block diagram of an embodiment of a system that includes an integrated circuit with a control circuit for monitoring temperature sensor circuits is shown. System 300 includes integrated circuit 200 and management circuit 370. A portion of integrated circuit 200 from FIG. 2 is shown, including control circuit 205 and processor core 201b. Control circuit 205 determines, as described above, temperature estimate 320b for processor core 201b using various inputs, including temperature samples 315e-315h (collectively 315), operating mode 335, power estimate 350, and thermal conductivity 360. FIG. 3 also includes chart 390 depicting an temperature estimate 320b over time.

As illustrated, control circuit 205 is configured to collect temperature samples 315 from temperature sensor circuits 210c and 210d. Temperature samples 315e and 315f, from temperature sensor circuit 210c, provide indications of a temperature of region 212c. Similarly, temperature samples 315g and 315h, from temperature sensor circuit 210d, provide indications of a temperature of region 212d. To determine temperature estimate 320b, control circuit 205 is configured to use, in combination with temperature samples 315, additional information, such as power estimate 350 for processor core 201b that is within respective regions 212c and 212d. Power estimate 350 may be based on a current workload of processor core 201b, or of a functional circuit within processor core 201b. For example, power estimate 350 may provide an indication of a number of memory commands sent to and/or in queue for load-store circuit 232b, a number of floating-point instructions sent to co-processor circuit 234b, a number of integer or Boolean instructions sent to execution circuits 230c and 230d. In some embodiments, power estimate 350 may include indications of voltage levels of power supply signals and/or frequencies of clock signals received by processor core 201b, and/or indicate whether such power and clock signals are currently gated. In other embodiments, such information may be included in operating mode 335.

In some embodiments, control circuit 205 may determine temperature estimate 320b using information related to individual ones of the functional circuits in processor core 201b. For example, respective temperature estimates for two or more of the functional circuits in processor core 201b may be generated and then temperature estimate 320b for all of processor core 201b may be determined using, for example, respective temperature estimates for execution circuits 230c and 230d, for load-store circuit 232b, and for co-processor circuit 234b.

Determination of temperature estimate 320b may include utilizing a distance from ones of the various functional circuits to respective temperature sensor circuits 210c and 210d. For example, co-processor circuit 234b is located closer to temperature sensor circuit 210c than to temperature sensor circuit 210d. Accordingly, heat generated by co-processor circuit 234b may affect the temperature samples 315e and 315f more than temperature samples 315g and 315h. To determine temperature estimate 320b, control circuit may be further configured to use a value for thermal conductivity 360 to estimate a difference between a given temperature sample and a temperature of co-processor circuit 234b in the respective regions 212c and 212d.

As shown, operating mode 335 may be indicative of an operating mode of processor core 201b as a whole, and/or may include indications of an operating mode for one or more of the functional circuits in processor core 201b. For example, operating mode 335 may include a status of co-processor circuit 234b indicating whether co-processor circuit 234b is currently enabled or disabled. As disclosed above, indications of voltage levels of power supply signals and/or clock signals received by processor core 201b may, in some embodiments, be included in operating mode 335. According, various portions of operating mode 335 may be received from processor core 201b and/or management circuit 370.

After temperature estimate 320*b* has been determined, control circuit 205 may send temperature estimate 320*b* and processor core identifier (ID) 302*b* (for processor core 201*b*) to management circuit 370. As illustrated, management circuit 370 is configured to adjust operating parameters 375 for the identified processor core 201*b* using temperature estimate 320*b*. Management circuit 370 receives processor core identifier 302*b* and temperature estimate 320*b*. In response to this information that processor core 201*b* is operating at the estimated temperature, management circuit 370 may determine if operating parameters (e.g., power signal voltage levels, clock signal frequencies, operating modes, and the like) for processor core 201*b* should be altered. For example, processor core 201*b* may have a temperature that is above a threshold value and management circuit 370 may, in response, place processor core 201*b* into a reduced power mode to reduce heat generated by processor core 201*b*. In contrast, if the estimated temperature is below the threshold value (or a different, lower threshold value), then management circuit 370 may increase the frequency of the one or more clock signals and/or may place processor core 201*b* into a higher performance operating mode that increases a processing bandwidth of processor core 201*b*.

Management circuit 370, in some embodiments, may set operating parameters for more than one functional circuit in integrated circuit 200. Referring to FIG. 2, control circuit 205 may determine a different temperature estimate for processor core 201*a* using a technique such as described for determining temperature estimate 320*b*. Control circuit 205 may then send the different temperature estimate and a different processor core identifier for processor core 201*a* to management circuit 370. In a similar manner as described above, management circuit 370 receives the different processor core identifier and different temperature estimate and, in response, may determine if operating parameters for processor core 201*a* should be altered. Accordingly, management circuit 370 may be configured to select, using temperature estimate 320*b*, a particular set of operating parameters 375 for processor core 201*b*, and select, using the different temperature estimate, a different set of operating parameters for processor core 201*a*.

As depicted, chart 390 illustrates a temperature profile for temperature estimate 320*b* related to processor core 201*b*. From time t0 to time t1, temperature estimate 320*b* remains steady, below a first threshold of 55 deg C. Between times t1 and t2, temperature estimate 320*b* increases, but remains below the threshold of 55 deg C. At times t2 and t3, temperature estimate 320*b* satisfies the thresholds of 55 deg C. and 70 deg C, respectively. Control circuit 205 is configured to track increases in a series of temperature estimates 320*b* to determine when to increase a particular sample rate being used to collect temperature samples 315. In some embodiments, control circuit 205 may increase the particular sample rate as each threshold is satisfied, at 55 deg C. and 70 deg C.

For example, between times t0 and t2, control circuit 205 may select a sample rate of collecting samples every one second, resulting in control circuit 205 enabling temperature sensor circuits 210*c* and 210*d* once every second, taking one or more temperature samples, and then disabling temperature sensor circuits 210*c* and 210*d* until a next one second interval elapses. Control circuit 205 may generate one value for temperature estimate 320*b* every second. At time t2, the sample rate may be increased to sampling every 500 milliseconds (msec), and increased again at time t3 to sampling every 250 msec. Accordingly, as processor core 201*b* gets hotter, the temperature sampling becomes more frequent.

For example, a next threshold of 85 deg C, may correspond to a maximum operating temperature for full power operation of processor core 201*b* and may therefore require reducing generated heat by placing processor core 201*b* into a reduced power state.

In some embodiments, control circuit 205 may determine a rate of change of temperature estimates 320*b* in addition to comparing temperature estimates 320*b* to one or more threshold values. As shown in chart 390, a rate of change of temperature estimates 320*b* decreases between times t2 and t3 as compared to times t1 to t2. In response to the slower rate of change, the sample rate used between times t2 and t3 may be lower than if the rate of change remained constant. Similarly, if the rate of change were to increase between times t2 and t3 rather than decrease as shown, the sample rate may be further increased before reaching time t3.

Control circuit 205 is further configured to track decreases in the series of temperature estimates 320*b* to determine when to decrease the particular sample rate. As temperature estimates 320*b* decrease, control circuit 205 may reduce the sample rate as threshold values are satisfied, such as at times t4 and t5. In some embodiments, different threshold values may be used for rising temperature estimates 320*b* than for falling temperature estimates 320*b*. For example, satisfying the 70 deg C. threshold may be used to determine to increase the particular sample rate as temperature estimates 320*b* increase, while satisfying the 55 deg C. threshold may be used to decrease the particular sample rate as temperature estimates 320*b* are decreasing. Using different thresholds may create hysteresis to avoid the particular sample rate from oscillating between higher and lower rates when a temperature estimate 320*b* remains steady near the threshold value. In a manner as described above, control circuit 205 may utilize, in addition to threshold values, a rate of change of temperature estimates 320*b* for determining sample rates while temperature estimates 320*b* are falling. In such embodiments, a determination that temperature estimates 320*b* are falling rapidly, such as between times t4 and t5, the sample rate may be further decreased from a rate set at time t4.

It is noted that FIG. 3 is merely an example. System 300 is shown with elements necessary to describe the disclosed techniques. Chart 390 is simplified for clarity. In other embodiments, temperature estimates may have more variance and therefore, such a chart may not be as linear as shown. The example values used for thresholds and sample rates are merely used as examples, and are not intended to be limiting. Any suitable values may be used as appropriate for a given application.

In the description of FIGS. 1-3, sample rates for a plurality of temperature sensor circuits are described as being adjusted based on current temperature estimates. Sample rates may be determined using a variety of techniques. An example of selecting a particular sample rate based on a temperature estimate and operating mode is depicted in FIG. 4.

Figure 4:
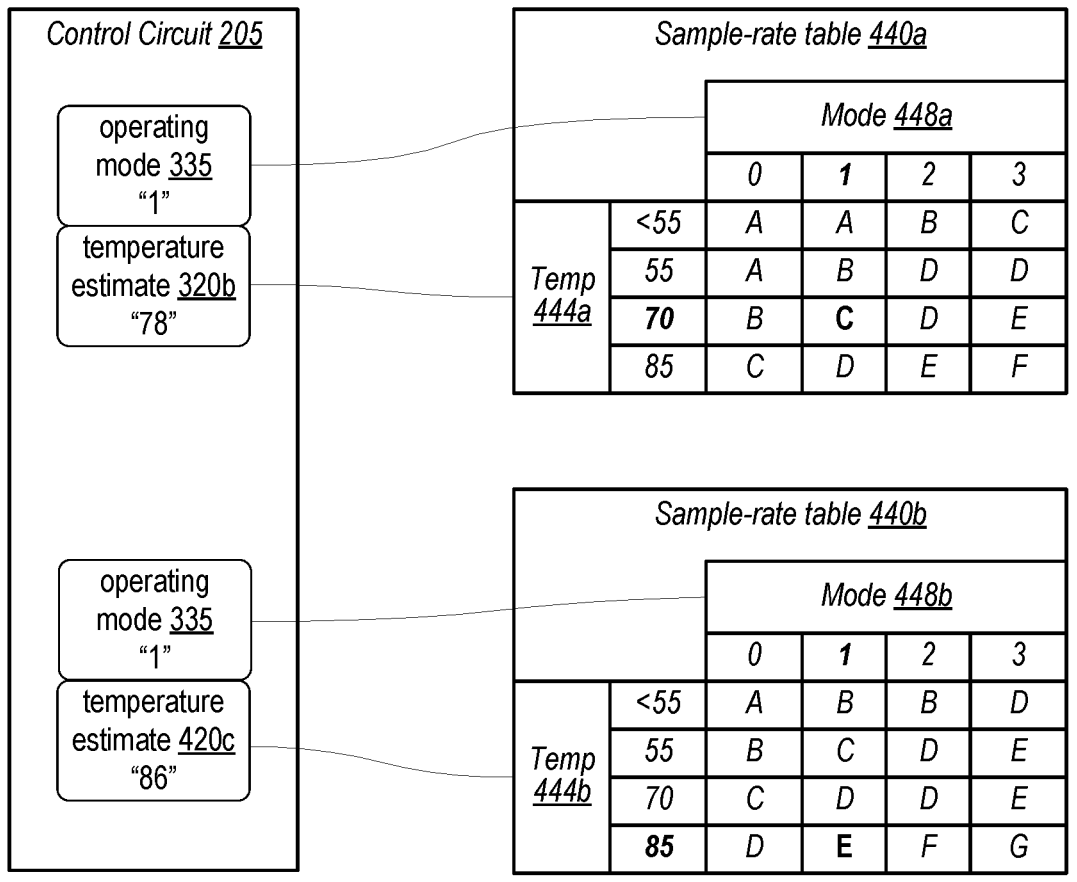
FIG. 4 illustrates a block diagram of an embodiment of sample-rate tables used by a control circuit.

Proceeding to FIG. 4, a block diagram of an embodiment of an integrated circuit with a control circuit for monitoring temperature sensor circuits is shown. A portion of integrated circuit 200 is shown ion FIG. 4, including control circuit 205 which has access to a plurality of sample-rate tables, including sample-rate tables 440*a* and 440*b* (collectively 440). Using current information (e.g., temperature estimate 320*b* and operating mode 335 from FIG. 3), control circuit 205 accesses one or both of sample-rate tables to 440 to determine a sample-rate for subsequent sampling of temperature sensors.

As illustrated, sample-rate tables 440a and 440b include a plurality of sample rates mapped to a corresponding plurality of temperature estimates (temp) 444, as well as to a plurality of operating modes (mode) 448. In the illustrated example, four different temperature ranges are included in each of sample-rate tables 440, less than 55 degrees Celsius (deg C), 55 deg C. to less than 70 deg C. 70 deg C. to less than 85 deg C, and greater than or equal to 85 deg C. Similarly, there are four modes 448 in each sample-rate table 440. These modes may represent different power modes (e.g., stand-by, idle, full power, etc.), functional modes (e.g., various functionality enabled or disabled), operating parameters (e.g., various combinations of power supply voltages and clock signal frequencies), or combinations thereof. Among the sixteen entries in each sample-rate table 440, six different sample rates are shown, labeled 'A' to 'F,' each letter representing a different sample-rate. In the current example, 'A' represents a slowest sample rate, increasing in alphabetical order up to the fastest sample rate of 'F.' In other embodiments, any suitable number of different sample rates may be included.

To determine whether temperature estimate 320b satisfies a threshold value for adjusting a sample rate, control circuit 205 is configured to use temperature estimate 320b to access a particular entry in sample-rate table 440a to select an adjusted sample rate. Sample-rate table 440a is accessed by cross-referencing temperature estimate 320b (78 degrees Celsius) with temp 444a, along with operating mode 335 (mode 1) with mode 448a. The particular entry for these inputs indicates use of sample rate 'C.' As shown in FIG. 3, temperature estimate 320b is determined using temperature samples 315e and 315f from temperature sensor circuit 210c, and temperature samples 315g and 315h from temperature sensor circuit 210d. If a current sample rate for these temperature sensors is different from rate 'C,' then the sample rate for collecting subsequent samples from temperature sensor circuits 210c and 210d may be changed to sample rate 'C.'

In some embodiments, however, temperature sensor circuits 210c and 210d may be used to estimate a temperature of a plurality of circuits. For example, temperature estimate 320b may correspond to co-processor circuit 234b. Using the same temperature samples 315e-315h, control circuit 205 may determine a different temperature estimate 420c that corresponds to execution circuit 230c. Control circuit 205 may use physical distances of execution circuit 230c from temperature sensor circuits 210c and 210, respectively, to determine temperature estimate 420c. Since execution circuit 230c may have different physical distances form temperature sensor circuits 210c and 210 than co-processor circuit 234b, temperature estimate 420c may have a different value from temperature estimate 320b despite being determined from the same set of temperature samples 315e-315h.

Control circuit 205, as shown, is configured to access a particular one of sample-rate tables 440 based on a type of the functional circuit that is within the respective regions 212 of temperature sensor circuits 210c and 210d. As described, sample-rate table 440a is used to determine a sample rate for co-processor circuit 234b. Sample-rate table 440b, however, is used for determining a sample rate for execution circuit 230c. Using current information related to execution circuit 230c, e.g., temperature estimate 420c and operating mode 335, control circuit 205 accesses the mode 448b column and 85 deg C. row of sample-rate table 440b to retrieve an entry with a sample rate value of 'E,' which is a higher sample rate than 'C' that was determined for co-processor circuit 234b.

If different temperature sensor circuits 210 were used for estimating respective temperatures for execution circuit 230c and co-processor circuit 234b, then the respective sets of temperature sensor circuits 210 would be sampled using the respective sample rates 'C' and 'E' to determine subsequent values for temperature estimates 320b and 420c. In the illustrated example, however, the same temperature sensor circuits 210c and 210d are used for determining both temperature estimates 320b and 420c. Accordingly, the higher sample rate may be used for collecting subsequent temperature samples. In some embodiments, control circuit 205 may use all samples from the higher sample rate when determining subsequent values of temperature estimate 320b. In other embodiments, control circuit 205 may use a subset of samples that corresponds to sample rate 'C.' For example, if sample rate 'E' is a sample every 200 msec and sample rate 'C' is a sample every 600 msec, then three times as many temperature samples will be collected using the 'E' sample rate. Subsequent temperature estimates 320b may be determined using every third temperature sample rather than all temperature samples such as will be used for determining subsequent temperature estimates 420c.

It is noted that integrated circuit 200 as shown in FIG. 4 is associated with one example of using a plurality of sample-rate tables to determine sample rates for temperature sensor circuits. Although the different sample-rate tables are described as being used for different circuits within a processor core, in other embodiments, the different sample-rate tables may be used for different processor cores (e.g., sample-rate table 440a used for all circuits in processor core 201a, and sample-rate table 440b used for all circuits in processor core 201b). The illustrated sample-rate tables utilize two inputs for accessing a specific entry. In other embodiments, any suitable number of inputs may be used to determine a particular entry. Each input is shown with four values/ranges. In other embodiments, any suitable number of values/ranges may be established for each input.

To summarize, various embodiments of a system that adjusts sample rates for a plurality of temperature sensor circuits based on current conditions are disclosed. Broadly speaking, apparatus, systems, and methods are contemplated in which an embodiment of an apparatus, for example, includes an integrated circuit that includes a plurality of temperature sensor circuits, placed in respective locations distributed across the integrated circuit, and a control circuit. Ones of the plurality of temperature sensor circuits may be configured to produce respective sets of temperature samples indicating an operating temperature of a respective region of the integrated circuit. The control circuit may be configured to sample, using a particular sample rate, respective temperature samples from a subset of the plurality of temperature sensor circuits. The control circuit may be further configured to determine a particular temperature estimate using one or more of the temperature samples and an operating mode of a functional circuit within the respective regions of the subset of temperature sensors. In response to a determination that the particular temperature estimate satisfies a threshold value, the control circuit may be configured to adjust the particular sample rate for subsequent temperature samples.

In a further example, to determine whether the particular temperature estimate satisfies the threshold value, the control circuit may be configured to use the particular temperature estimate to access a particular entry in a sample-rate table to select an adjusted sample rate, wherein the sample-rate table includes a plurality of sample rates mapped to a corresponding plurality of temperature estimates. In an example, the integrated circuit may include a plurality of sample-rate tables. The control circuit may be further configured to access a particular one of the plurality of sample-rate tables based on a type of the functional circuit that is within the respective regions of the subset of temperature sensor circuits.

In another example, the subset of the plurality of temperature sensor circuits may be distributed among a plurality of functional circuits included within a particular processor core of a multicore processor included on the integrated circuit. In a further example, the particular temperature estimate may be indicative of a temperature of the particular processor core.

In one example, the control circuit may be further configured to sample, using a different sample rate, respective temperature samples from a different subset of the plurality of temperature sensor circuits, and to determine a different temperature estimate using one or more of the temperature samples of the different subset, wherein the different temperature estimate is indicative of a temperature of a different processor core. In another example, to determine the particular temperature estimate, the control circuit may be further configured to use a power estimate for the functional circuit within the respective regions. The power estimate may be based on a current workload of the functional circuit.

In an example, the control circuit may be further configured to track increases in a series of temperature estimates to determine when to increase the particular sample rate, and to track decreases in the series of temperature estimates to determine when to decrease the particular sample rate. In a further example, to determine the particular temperature estimate, the control circuit may be further configured to use a thermal conductivity value to estimate a difference between a given temperature sample and a temperature of the functional circuit in the respective regions.

The circuits and techniques described above in regards to FIGS. 1-4 may be performed using a variety of methods. Three methods associated with determining temperature estimates and setting temperature sensor circuit sample rates are described below in regards to FIGS. 5-7.

Turning now to FIG. 5, a flow diagram for an embodiment of a method for determining a temperature estimate using temperature samples from a plurality of temperature sensor circuits is illustrated. Method 500 may be used in conjunction with any of the computer circuitry, systems, devices, elements, or components disclosed herein, such as integrated circuits 100 and 200. Method 500 is described below using integrated circuit 100 of FIG. 1 as an example. References to elements in FIG. 1 are included as non-limiting examples.

As illustrated, method 500 begins in block 510 by sampling, using a particular sample rate, a subset of a plurality of temperature sensor circuits to generate a set of temperature samples, wherein the plurality of temperature sensor circuits are distributed across an integrated circuit. For example, temperature sensor circuits 110a and 110b are placed in respective locations in different regions 112 of integrated circuit 100. Control circuit 105 collects temperature samples 115a-115c from temperature sensor circuit 110a and temperature samples 115d and 115e from temperature sensor circuit 110b. In some embodiments, such as in integrated circuit 200 of FIG. 2, a subset of a plurality of temperature sensor circuits 210 may be distributed among a plurality of functional circuits included within a particular processor core (201a and 201b) of a multicore processor included on integrated circuit 200.

Method 500 continues in block 520 by determining, using the set of temperature samples and an operating mode of a particular functional circuit on the integrated circuit, a particular temperature estimate indicative of a temperature of the particular functional circuit. As shown in FIG. 1, temperature samples 115a-115c may be used to determine temperature estimate 120a. In addition, temperature estimate 120a may be determined using a power estimate for functional circuit 130a. For example, operating mode 135a may be used to estimate a current power consumption by functional circuit 130a. Operating mode 135a may indicate that functional circuit 130a is in a standby mode. Since functional circuit 130a may consume little power in the standby mode, functional circuit 130a may contribute little to no heat to region 112a while it is in the standby mode. Accordingly, temperature estimate 120a may be a lower value than the temperature samples 115a-115c, the difference based, e.g., on a distance between functional circuit 130a and temperature sensor circuit 110a as well as a thermal conductivity associated with integrated circuit 100. Instead of, or in addition to, operating mode 135a, the power estimate may be based on a current workload of functional circuit 130a. A current workload may be based on a number of instructions queued for processing by functional circuit 130a. For example, functional circuit 130a may be a processor core with an instruction buffer to hold instructions until the processor core is ready to perform the instructions. A workload may be determined based on a rate at which instructions are issued or retired from the instruction buffer.

At block 530, method 500 continues by determining, using the particular temperature estimate, whether to adjust a sample rate for subsequent samples. Control circuit 105, for example, may compare temperature estimate 120a to threshold value 125. Threshold value 125, as shown, corresponds to a particular temperature at which a sample rate for collecting temperature samples 115 changes from a first rate to a second rate, greater than the first rate. If temperature estimate 120a, e.g., is less than or equal to threshold value 125, then the first sample rate is used for collecting subsequent samples. Otherwise, if temperature estimate 120a is greater than threshold value 125, then the second, higher rate is used for collecting subsequent samples.

It is noted that the method of FIG. 5 includes elements 510-530. Method 500 may end in block 530 or may repeat some or all blocks of the method. For example, method 500 may return to block 510 to collect a next set of temperature samples. In some cases, method 500 may be performed concurrently with other instantiations of the method. For example, control circuit 105 may perform an instance of method 500 to collect temperature samples 115d and 115e to determine temperature estimate 120b while performing a different instance of method 500 to determine temperature estimate 120a.

Proceeding now to FIG. 6, a flow diagram for an embodiment of a method for tracking increasing and decreasing temperature gradients is illustrated. Similar to method 500, method 600 may be used in conjunction with any of the computer circuitry, systems, devices, elements, or components disclosed herein, such as integrated circuits 100 and 200. Method 600 is described below using integrated circuit 200 of FIG. 3 as an example. References to elements in FIG. 3 are included as non-limiting examples.

As illustrated, method 600 begins in block 610 by, using a first temperature gradient to track increases in a series of temperature values. Referring to FIG. 3 as an example, chart 390 graphically depicts a series of temperature estimates 320b related to a temperature of processor core 201b. From time t1 through past time t3, the series of temperature estimates 320b is increasing. From time t1 to time t2, temperature estimates 320*b* increase with a first gradient. After time t2, temperature estimates 320*b* increase with a second gradient that is less than the first gradient. Control circuit 205 may, in addition to determining temperature estimates 320*b*, determine a gradient indicative of a rate of change of the current temperature estimate 320*c* in comparison to one or more previous temperature estimates 320*b*.

Method 600 continues in block 620 by using a first set of thresholds to determine when to increase the sample rate. For example, 70 deg C. may be used as a rising threshold for switching between a first sample rate and a second, higher sample rate. In addition, a current value for the gradient may be used to further adjust the sample rate. Temperature estimates 320*b* from time t1 to time t2 are below the 70 deg C. threshold, resulting in the first sample rate being used. The higher rising gradient of the series of temperature estimates 320*b* during this time period (in comparison to the gradient after time t2) may cause control circuit 205 to adjust the sample rate to a higher sample rate, such as the second sample rate or a third sample rate between the first and second sample rates.

At block 630, method 600 proceeds by using a second temperature gradient to track decreases in the series of temperature values to determine when to decrease the sample rate. In a similar manner as described in regards to block 610, control circuit 205 may track falling values of the series of temperature estimates 320*b*. From before time t4 to beyond time t5, the series of temperature estimates 320*b* is decreasing. Before time t5, temperature estimates 320*b* decrease with a third gradient. After time t5, temperature estimates 320*b* decrease more slowly with a fourth gradient. As described above, control circuit 205 may determine gradients for the current temperature estimates 320*c* as the temperatures fall.

Method 600 further continues in block 640 by using a second set of thresholds to determine when to decrease the sample rate. For example, 55 deg C. may be used as a falling threshold for switching from the second sample rate and to the first, lower sample rate. As described above, a current value for the gradient may be used to further adjust the sample rate. Accordingly, the sample rate may be reduced from the second sample rate to the third or even first sample rates prior to time t5 due to the higher descending gradient before time t5 as compared to after time t5.

It is noted that method 600 includes elements 610-640. Method 600 may end in block 640 or may repeat some or all blocks of the method. For example, method 600 may repeat blocks 610 and 620 while the series of temperature estimates continues to increase. Similarly, method 600 may repeat blocks 630 and 640 while the series of temperature estimates continues to decrease. In a manner as described above for method 500, method 600 may be performed concurrently with other instantiations of the method. For example, a first instance of method 600 may be performed by control circuit 205 to track a series of increasing temperature estimates for processor core 201*a* while a second instance is performed to track a series of decreasing temperature estimates for processor core 201*b*.

Moving to FIG. 7, a flow diagram for an embodiment of a method for determining temperature estimates using physical locations of a plurality of functional circuits to determine respective temperature estimates for ones of the functional circuits is illustrated. In a similar manner as methods 500 and 600, method 700 may be used in conjunction with any of the computer circuitry, systems, devices, elements, or components disclosed herein, such as integrated circuits 100 or 200. Method 700 is described below using integrated circuit 200 of FIG. 3 as a non-limiting example.

As illustrated, method 700 begins in block 710 by sampling, by a control circuit, a subset of a plurality of temperature sensor circuits to generate a set of temperature samples, wherein the plurality of temperature sensor circuits are distributed across an integrated circuit. For example, temperature samples 315*e* and 315*f* are generated by temperature sensor circuit 210*c* while temperature samples 315*g* and 315*h* are generated by temperature sensor circuit 210*d*. These temperature samples 315*e*-315*h* are collected by control circuit 205. As shown in FIG. 3, temperature sensor circuits 210*c* and 210*d* are distributed across different regions 212 of integrated circuit 200.

At block 720, method 700 continues by using respective physical locations of a particular functional circuit and a different functional circuit in relation to the respective physical locations of the subset of temperature sensor circuits to determine respective temperature estimates for the particular and different functional circuits. For example, the particular function circuit may be execution circuit 230*c* while the different functional circuit is co-processor circuit 234*b*. Two different temperature estimates may be generated, by control circuit 205, for execution circuit 230*c* and co-processor circuit 234*b*, respectively. To a first temperature estimate for execution circuit 230*c*, a distance between temperature sensor circuit 210*c* and execution circuit 230*c* may be used to weight temperature samples 315*e* and 315*f* when using these temperature samples to determine the first temperature estimate. The weighting may be further adjusted based on a thermal conductivity associated with integrated circuit 200. Temperature samples 315*g* and 315*h* may similarly weighted based on a distance between execution circuit 230*c* and temperature sensor circuit 210*d*. This process may be repeated to determine the second temperature estimate based on distances between co-processor circuit 234*b* and each of temperature sensor circuits 210*c* and 210*d*.

Method 700 continues in block 730 by determining, using the respective temperature estimates, a first and a second new sample rate for subsequent sampling of the subset of temperature sensors. The first and second temperature estimates may be compared to one or more threshold values to determine respective sample rates. In other embodiments, one or more lookup tables may be accessed using the first and second temperature estimates as indices into the tables. In some embodiments, a different threshold value or different lookup table may be used for each of the first and second temperature estimates. For example, the types of functional circuits (execution circuit and co-processor circuit) may be used to select a threshold value or lookup table for the respective temperature estimate.

Method 700 proceeds in block 740 by selecting, from the first and second new sample rates, a higher value to use as the new sample rate. Based on different distances from the different functional circuits to temperature sensor circuits 210*c* and 210*d*, the first and second temperature estimates may have different values, despite being determined from the same set of temperature samples. Accordingly, the first and second temperature estimates may result in different sample rates. Since the same temperature sensor circuits 210*c* and 210*d* are used for estimating temperatures of execution circuit 230*c* and co-processor circuit 234*b*, a high sampling rate is selected for use for collecting subsequent samples from temperature sensor circuits 210*c* and 210*d*. As previously described, subsequent values for the temperature estimate associated with the slower sample rate may be determined using a subset of the subsequent temperature samples while the temperature estimate associated with the higher sample rate may be determined using all of the subsequent temperature samples.

It is noted that method 700 includes elements 710-740. Method 700 may end in block 740, or some or all blocks of the method may be repeated. For example, method 700 may return to block 710 at a subsequent sample time. In some cases, method 700 may be performed concurrently with other instances of itself or the other disclosed methods 500 and 600.

Figure 8:
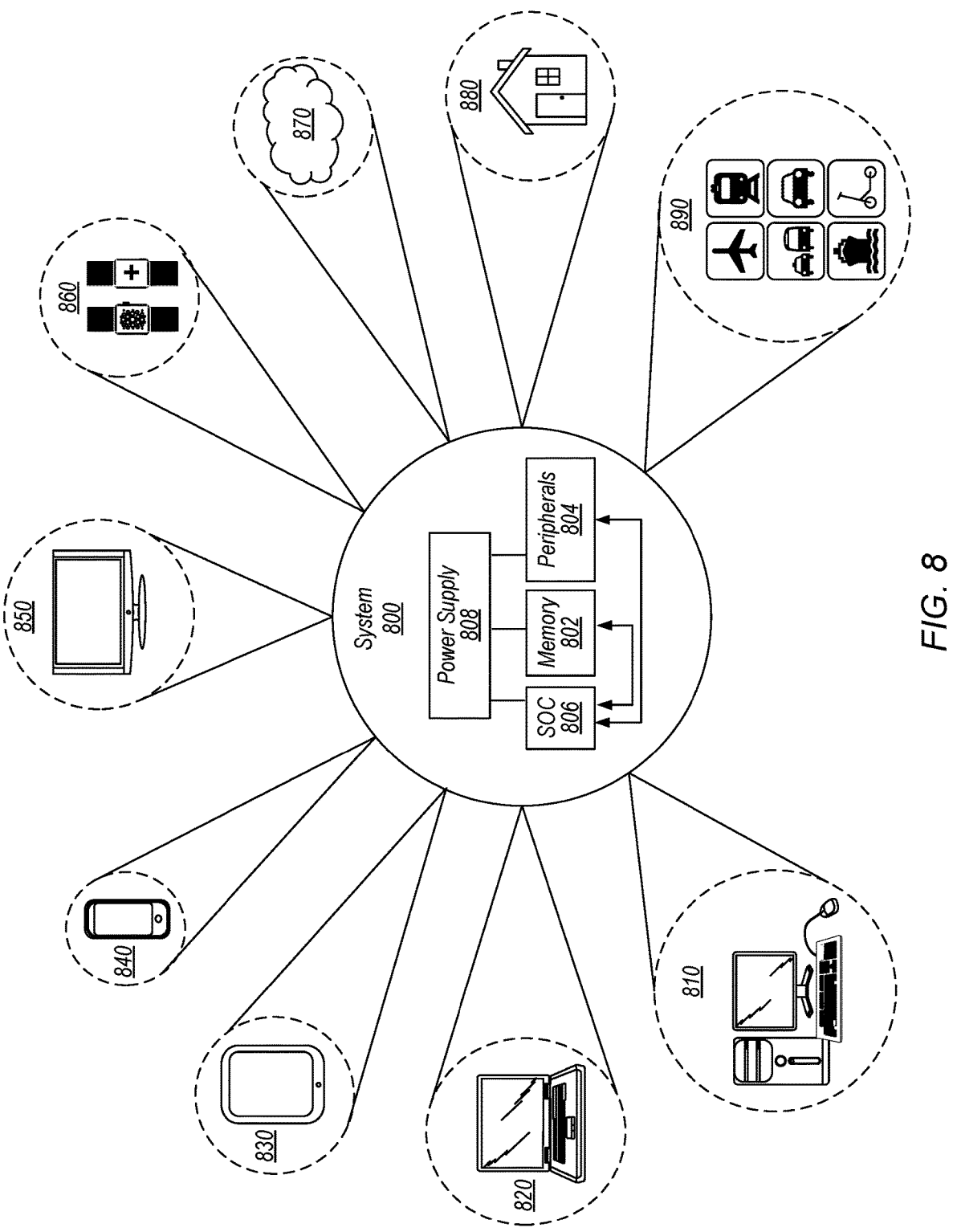
FIG. 8 shows various embodiments of systems that include integrated circuits that utilize the disclosed techniques.

FIGS. 1-7 illustrate circuits and methods for a system, such as an integrated circuit, that includes a store-load dependency circuit. Any embodiment of the disclosed systems may be included in one or more of a variety of computer systems, such as a desktop computer, laptop computer, smartphone, tablet, wearable device, and the like. In some embodiments, the circuits described above may be implemented on a system-on-chip (SoC) or other type of integrated circuit. A block diagram illustrating an embodiment of computer system 800 is illustrated in FIG. 8. SoC 806 may, in some embodiments, include any disclosed embodiment of integrated circuit 100 or 200 in FIGS. 1 and 2.

In the illustrated embodiment, the system 800 includes at least one instance of a system on chip (SoC) 806 which may include multiple types of processor circuits, such as a central processing unit (CPU), a graphics processing unit (GPU), or otherwise, a communication fabric, and interfaces to memories and input/output devices. One or more of these processor circuits may correspond to an instance of the processor cores disclosed herein. In various embodiments, SoC 806 is coupled to external memory circuit 802, peripherals 804, and power supply 808.

A power supply 808 is also provided which supplies the supply voltages to SoC 806 as well as one or more supply voltages to external memory circuit 802 and/or the peripherals 804. In various embodiments, power supply 808 represents a battery (e.g., a rechargeable battery in a smart phone, laptop or tablet computer, or other device). In some embodiments, more than one instance of SoC 806 is included (and more than one external memory circuit 802 is included as well).

External memory circuit 802 is any type of memory, such as dynamic random access memory (DRAM), synchronous DRAM (SDRAM), double data rate (DDR, DDR2, DDR3, etc.) SDRAM (including mobile versions of the SDRAMs such as mDDR3, etc., and/or low power versions of the SDRAMs such as LPDDR2, etc.), RAMBUS DRAM (RDRAM), static RAM (SRAM), etc. In some embodiments, external memory circuit 802 may include non-volatile memory such as flash memory, ferroelectric random-access memory (FRAM), or magnetoresistive RAM (MRAM). One or more memory devices may be coupled onto a circuit board to form memory modules such as single inline memory modules (SIMMs), dual inline memory modules (DIMMs), etc. Alternatively, the devices may be mounted with a SoC or an integrated circuit in a chip-on-chip configuration, a package-on-package configuration, or a multi-chip module configuration.

The peripherals 804 include any desired circuitry, depending on the type of system 800. For example, in one embodiment, peripherals 804 includes devices for various types of wireless communication, such as Wi-Fi, Bluetooth, cellular, global positioning system, etc. In some embodiments, the peripherals 804 also include additional storage, including RAM storage, solid state storage, or disk storage. The peripherals 804 include user interface devices such as a display screen, including touch display screens or multi-touch display screens, keyboard or other input devices, microphones, speakers, etc.

As illustrated, system 800 is shown to have application in a wide range of areas. For example, system 800 may be utilized as part of the chips, circuitry, components, etc., of a desktop computer 810, laptop computer 820, tablet computer 830, cellular or mobile phone 840, or television 850 (or set-top box coupled to a television). Also illustrated is a smartwatch and health monitoring device 860. In some embodiments, the smartwatch may include a variety of general-purpose computing related functions. For example, the smartwatch may provide access to email, cellphone service, a user calendar, and so on. In various embodiments, a health monitoring device may be a dedicated medical device or otherwise include dedicated health related functionality. In various embodiments, the above-mentioned smartwatch may or may not include some or any health monitoring related functions. Other wearable devices 860 are contemplated as well, such as devices worn around the neck, devices attached to hats or other headgear, devices that are implantable in the human body, eyeglasses designed to provide an augmented and/or virtual reality experience, and so on.

System 800 may further be used as part of a cloud-based service(s) 870. For example, the previously mentioned devices, and/or other devices, may access computing resources in the cloud (i.e., remotely located hardware and/or software resources). Still further, system 800 may be utilized in one or more devices of a home 880 other than those previously mentioned. For example, appliances within the home may monitor and detect conditions that warrant attention. Various devices within the home (e.g., a refrigerator, a cooling system, etc.) may monitor the status of the device and provide an alert to the homeowner (or, for example, a repair facility) should a particular event be detected. Alternatively, a thermostat may monitor the temperature in the home and may automate adjustments to a heating/cooling system based on a history of responses to various conditions by the homeowner. Also illustrated in FIG. 8 is the application of system 800 to various modes of transportation 890. For example, system 800 may be used in the control and/or entertainment systems of aircraft, trains, buses, cars for hire, private automobiles, waterborne vessels from private boats to cruise liners, scooters (for rent or owned), and so on. In various cases, system 800 may be used to provide automated guidance (e.g., self-driving vehicles), general systems control, and otherwise.

It is noted that the wide variety of potential applications for system 800 may include a variety of performance, cost, and power consumption requirements. Accordingly, a scalable solution enabling use of one or more integrated circuits to provide a suitable combination of performance, cost, and power consumption may be beneficial. These and many other embodiments are possible and are contemplated. It is noted that the devices and applications illustrated in FIG. 8 are illustrative only and are not intended to be limiting. Other devices are possible and are contemplated.

As disclosed in regards to FIG. 8, computer system 800 may include one or more integrated circuits included within a personal computer, smart phone, tablet computer, or other type of computing device. A process for designing and producing an integrated circuit using design information is presented below in FIG. 9.

Figure 9:
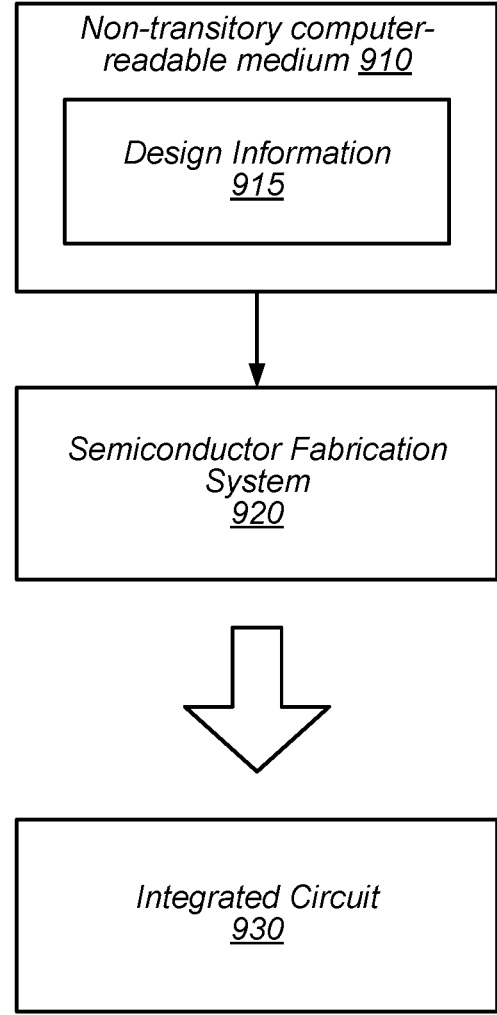
FIG. 9 is a block diagram of an example computer-readable medium, according to some embodiments.

FIG. 9 is a block diagram illustrating an example of a non-transitory computer-readable storage medium that stores circuit design information, according to some embodiments. The embodiment of FIG. 9 may be utilized in a process to design and manufacture integrated circuits, for example, including one or more instances of integrated circuits 100 and 200 shown in FIGS. 1 and 2. In the illustrated embodiment, semiconductor fabrication system 920 is configured to process the design information 915 stored on non-transitory computer-readable storage medium 910 and fabricate integrated circuit 930 based on the design information 915.

Non-transitory computer-readable storage medium 910, may comprise any of various appropriate types of memory devices or storage devices. Non-transitory computer-readable storage medium 910 may be an installation medium, e.g., a CD-ROM, floppy disks, or tape device; a computer system memory or random-access memory such as DRAM, DDR RAM, SRAM, EDO RAM, Rambus RAM, etc.; a non-volatile memory such as a Flash, magnetic media, e.g., a hard drive, or optical storage; registers, or other similar types of memory elements, etc. Non-transitory computer-readable storage medium 910 may include other types of non-transitory memory as well or combinations thereof. Non-transitory computer-readable storage medium 910 may include two or more memory mediums which may reside in different locations, e.g., in different computer systems that are connected over a network.

Design information 915 may be specified using any of various appropriate computer languages, including hardware description languages such as, without limitation: VHDL, Verilog, SystemC, System Verilog, RHDL, M, MyHDL, etc. Design information 915 may be usable by semiconductor fabrication system 920 to fabricate at least a portion of integrated circuit 930. The format of design information 915 may be recognized by at least one semiconductor fabrication system, such as semiconductor fabrication system 920, for example. In some embodiments, design information 915 may include a netlist that specifies elements of a cell library, as well as their connectivity. One or more cell libraries used during logic synthesis of circuits included in integrated circuit 930 may also be included in design information 915. Such cell libraries may include information indicative of device or transistor level netlists, mask design data, characterization data, and the like, of cells included in the cell library.

Integrated circuit 930 may, in various embodiments, include one or more custom macrocells, such as memories, analog or mixed-signal circuits, and the like. In such cases, design information 915 may include information related to included macrocells. Such information may include, without limitation, schematics capture database, mask design data, behavioral models, and device or transistor level netlists. As used herein, mask design data may be formatted according to graphic data system (gdsii), or any other suitable format.

Semiconductor fabrication system 920 may include any of various appropriate elements configured to fabricate integrated circuits. This may include, for example, elements for depositing semiconductor materials (e.g., on a wafer, which may include masking), removing materials, altering the shape of deposited materials, modifying materials (e.g., by doping materials or modifying dielectric constants using ultraviolet processing), etc. Semiconductor fabrication system 920 may also be configured to perform various testing of fabricated circuits for correct operation.

In various embodiments, integrated circuit 930 is configured to operate according to a circuit design specified by design information 915, which may include performing any of the functionality described herein. For example, integrated circuit 930 may include any of various elements shown or described herein. Further, integrated circuit 930 may be configured to perform various functions described herein in conjunction with other components.

As used herein, a phrase of the form "design information that specifies a design of a circuit configured to . . . " does not imply that the circuit in question must be fabricated in order for the element to be met. Rather, this phrase indicates that the design information describes a circuit that, upon being fabricated, will be configured to perform the indicated actions or will include the specified components.

The present disclosure includes references to an "embodiment" or groups of "embodiments" (e.g., "some embodiments" or "various embodiments"). Embodiments are different implementations or instances of the disclosed concepts. References to "an embodiment," "one embodiment," "a particular embodiment," and the like do not necessarily refer to the same embodiment. A large number of possible embodiments are contemplated, including those specifically disclosed, as well as modifications or alternatives that fall within the spirit or scope of the disclosure.

This disclosure may discuss potential advantages that may arise from the disclosed embodiments. Not all implementations of these embodiments will necessarily manifest any or all of the potential advantages. Whether an advantage is realized for a particular implementation depends on many factors, some of which are outside the scope of this disclosure. In fact, there are a number of reasons why an implementation that falls within the scope of the claims might not exhibit some or all of any disclosed advantages. For example, a particular implementation might include other circuitry outside the scope of the disclosure that, in conjunction with one of the disclosed embodiments, negates or diminishes one or more the disclosed advantages. Furthermore, suboptimal design execution of a particular implementation (e.g., implementation techniques or tools) could also negate or diminish disclosed advantages. Even assuming a skilled implementation, realization of advantages may still depend upon other factors such as the environmental circumstances in which the implementation is deployed. For example, inputs supplied to a particular implementation may prevent one or more problems addressed in this disclosure from arising on a particular occasion, with the result that the benefit of its solution may not be realized. Given the existence of possible factors external to this disclosure, it is expressly intended that any potential advantages described herein are not to be construed as claim limitations that must be met to demonstrate infringement. Rather, identification of such potential advantages is intended to illustrate the type(s) of improvement available to designers having the benefit of this disclosure. That such advantages are described permissively (e.g., stating that a particular advantage "may arise") is not intended to convey doubt about whether such advantages can in fact be realized, but rather to recognize the technical reality that realization of such advantages often depends on additional factors.

Unless stated otherwise, embodiments are non-limiting. That is, the disclosed embodiments are not intended to limit the scope of claims that are drafted based on this disclosure, even where only a single example is described with respect to a particular feature. The disclosed embodiments are intended to be illustrative rather than restrictive, absent any statements in the disclosure to the contrary. The application is thus intended to permit claims covering disclosed embodiments, as well as such alternatives, modifications, and equivalents that would be apparent to a person skilled in the art having the benefit of this disclosure.

For example, features in this application may be combined in any suitable manner. Accordingly, new claims may be formulated during prosecution of this application (or an application claiming priority thereto) to any such combination of features. In particular, with reference to the appended claims, features from dependent claims may be combined with those of other dependent claims where appropriate, including claims that depend from other independent claims. Similarly, features from respective independent claims may be combined where appropriate.

Accordingly, while the appended dependent claims may be drafted such that each depends on a single other claim, additional dependencies are also contemplated. Any combinations of features in the dependent that are consistent with this disclosure are contemplated and may be claimed in this or another application. In short, combinations are not limited to those specifically enumerated in the appended claims.

Where appropriate, it is also contemplated that claims drafted in one format or statutory type (e.g., apparatus) are intended to support corresponding claims of another format or statutory type (e.g., method).

Because this disclosure is a legal document, various terms and phrases may be subject to administrative and judicial interpretation. Public notice is hereby given that the following paragraphs, as well as definitions provided throughout the disclosure, are to be used in determining how to interpret claims that are drafted based on this disclosure.

References to a singular form of an item (i.e., a noun or noun phrase preceded by "a," "an," or "the") are, unless context clearly dictates otherwise, intended to mean "one or more." Reference to "an item" in a claim thus does not, without accompanying context, preclude additional instances of the item. A "plurality" of items refers to a set of two or more of the items.

The word "may" is used herein in a permissive sense (i.e., having the potential to, being able to) and not in a mandatory sense (i.e., must).

The terms "comprising" and "including," and forms thereof, are open-ended and mean "including, but not limited to."

When the term "or" is used in this disclosure with respect to a list of options, it will generally be understood to be used in the inclusive sense unless the context provides otherwise. Thus, a recitation of "x or y" is equivalent to "x or y, or both," and thus covers 1) x but not y, 2) y but not x, and 3) both x and y. On the other hand, a phrase such as "either x or y, but not both" makes clear that "or" is being used in the exclusive sense.

A recitation of "w, x, y, or z, or any combination thereof" or "at least one of . . . w, x, y, and z" is intended to cover all possibilities involving a single element up to the total number of elements in the set. For example, given the set [w, x, y, z], these phrasings cover any single element of the set (e.g., w but not x, y, or z), any two elements (e.g., w and x, but not y or z), any three elements (e.g., w, x, and y, but not z), and all four elements. The phrase "at least one of . . . w, x, y, and z" thus refers to at least one element of the set [w, x, y, z], thereby covering all possible combinations in this list of elements. This phrase is not to be interpreted to require that there is at least one instance of w, at least one instance of x, at least one instance of y, and at least one instance of z.

Various "labels" may precede nouns or noun phrases in this disclosure. Unless context provides otherwise, different labels used for a feature (e.g., "first circuit," "second circuit," "particular circuit," "given circuit," etc.) refer to different instances of the feature. Additionally, the labels "first," "second," and "third" when applied to a feature do not imply any type of ordering (e.g., spatial, temporal, logical, etc.), unless stated otherwise.

The phrase "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

The phrases "in response to" and "responsive to" describe one or more factors that trigger an effect. This phrase does not foreclose the possibility that additional factors may affect or otherwise trigger the effect, either jointly with the specified factors or independent from the specified factors. That is, an effect may be solely in response to those factors, or may be in response to the specified factors as well as other, unspecified factors. Consider the phrase "perform A in response to B." This phrase specifies that B is a factor that triggers the performance of A, or that triggers a particular result for A. This phrase does not foreclose that performing A may also be in response to some other factor, such as C. This phrase also does not foreclose that performing A may be jointly in response to B and C. This phrase is also intended to cover an embodiment in which A is performed solely in response to B. As used herein, the phrase "responsive to" is synonymous with the phrase "responsive at least in part to." Similarly, the phrase "in response to" is synonymous with the phrase "at least in part in response to."

Within this disclosure, different entities (which may variously be referred to as "units," "circuits," other components, etc.) may be described or claimed as "configured" to perform one or more tasks or operations. This formulation—[entity] configured to [perform one or more tasks]—is used herein to refer to structure (i.e., something physical). More specifically, this formulation is used to indicate that this structure is arranged to perform the one or more tasks during operation. A structure can be said to be "configured to" perform some task even if the structure is not currently being operated. Thus, an entity described or recited as being "configured to" perform some task refers to something physical, such as a device, circuit, a system having a processor unit and a memory storing program instructions executable to implement the task, etc. This phrase is not used herein to refer to something intangible.

In some cases, various units/circuits/components may be described herein as performing a set of task or operations. It is understood that those entities are "configured to" perform those tasks/operations, even if not specifically noted.

The term "configured to" is not intended to mean "configurable to." An unprogrammed FPGA, for example, would not be considered to be "configured to" perform a particular function. This unprogrammed FPGA may be "configurable to" perform that function, however. After appropriate programming, the FPGA may then be said to be "configured to" perform the particular function.

For purposes of United States patent applications based on this disclosure, reciting in a claim that a structure is "configured to" perform one or more tasks is expressly intended not to invoke 35 U.S.C. § 112(f) for that claim element. Should Applicant wish to invoke Section 112(f) during prosecution of a United States patent application based on this disclosure, it will recite claim elements using the "means for" [performing a function] construct.

Different "circuits" may be described in this disclosure. These circuits or "circuitry" constitute hardware that includes various types of circuit elements, such as combinatorial logic, clocked storage devices (e.g., flip-flops, registers, latches, etc.), finite state machines, memory (e.g., random-access memory, embedded dynamic random-access memory), programmable logic arrays, and so on. Circuitry may be custom designed, or taken from standard libraries. In various implementations, circuitry can, as appropriate, include digital components, analog components, or a combination of both. Certain types of circuits may be commonly referred to as "units" (e.g., a decode unit, an arithmetic logic unit (ALU), functional unit, memory management unit (MMU), etc.). Such units also refer to circuits or circuitry.

The disclosed circuits/units/components and other elements illustrated in the drawings and described herein thus include hardware elements such as those described in the preceding paragraph. In many instances, the internal arrangement of hardware elements within a particular circuit may be specified by describing the function of that circuit. For example, a particular "decode unit" may be described as performing the function of "processing an opcode of an instruction and routing that instruction to one or more of a plurality of functional units," which means that the decode unit is "configured to" perform this function. This specification of function is sufficient, to those skilled in the computer arts, to connote a set of possible structures for the circuit.

In various embodiments, as discussed in the preceding paragraph, circuits, units, and other elements may be defined by the functions or operations that they are configured to implement. The arrangement and such circuits/units/components with respect to each other and the manner in which they interact form a microarchitectural definition of the hardware that is ultimately manufactured in an integrated circuit or programmed into an FPGA to form a physical implementation of the microarchitectural definition. Thus, the microarchitectural definition is recognized by those of skill in the art as structure from which many physical implementations may be derived, all of which fall into the broader structure described by the microarchitectural definition. That is, a skilled artisan presented with the microarchitectural definition supplied in accordance with this disclosure may, without undue experimentation and with the application of ordinary skill, implement the structure by coding the description of the circuits/units/components in a hardware description language (HDL) such as Verilog or VHDL. The HDL description is often expressed in a fashion that may appear to be functional. But to those of skill in the art in this field, this HDL description is the manner that is used transform the structure of a circuit, unit, or component to the next level of implementational detail. Such an HDL description may take the form of behavioral code (which is typically not synthesizable), register transfer language (RTL) code (which, in contrast to behavioral code, is typically synthesizable), or structural code (e.g., a netlist specifying logic gates and their connectivity). The HDL description may subsequently be synthesized against a library of cells designed for a given integrated circuit fabrication technology, and may be modified for timing, power, and other reasons to result in a final design database that is transmitted to a foundry to generate masks and ultimately produce the integrated circuit. Some hardware circuits or portions thereof may also be custom-designed in a schematic editor and captured into the integrated circuit design along with synthesized circuitry. The integrated circuits may include transistors and other circuit elements (e.g. passive elements such as capacitors, resistors, inductors, etc.) and interconnect between the transistors and circuit elements. Some embodiments may implement multiple integrated circuits coupled together to implement the hardware circuits, and/or discrete elements may be used in some embodiments. Alternatively, the HDL design may be synthesized to a programmable logic array such as a field programmable gate array (FPGA) and may be implemented in the FPGA. This decoupling between the design of a group of circuits and the subsequent low-level implementation of these circuits commonly results in the scenario in which the circuit or logic designer never specifies a particular set of structures for the low-level implementation beyond a description of what the circuit is configured to do, as this process is performed at a different stage of the circuit implementation process.

The fact that many different low-level combinations of circuit elements may be used to implement the same specification of a circuit results in a large number of equivalent structures for that circuit. As noted, these low-level circuit implementations may vary according to changes in the fabrication technology, the foundry selected to manufacture the integrated circuit, the library of cells provided for a particular project, etc. In many cases, the choices made by different design tools or methodologies to produce these different implementations may be arbitrary.

Moreover, it is common for a single implementation of a particular functional specification of a circuit to include, for a given embodiment, a large number of devices (e.g., millions of transistors). Accordingly, the sheer volume of this information makes it impractical to provide a full recitation of the low-level structure used to implement a single embodiment, let alone the vast array of equivalent possible implementations. For this reason, the present disclosure describes structure of circuits using the functional shorthand commonly employed in the industry.

What is claimed is:

1. An apparatus comprising:
an integrated circuit including:
   a plurality of temperature sensor circuits placed in respective locations distributed across the integrated circuit, wherein ones of the plurality of temperature sensor circuits are configured to produce respective sets of temperature samples indicating an operating temperature of a respective region of the integrated circuit; and
   a control circuit configured to:
      sample, using a particular sample rate, respective temperature samples from a subset of the plurality of temperature sensor circuits;
      determine a particular temperature estimate using one or more of the temperature samples;
      adjust the particular temperature estimate based on an operating mode of a functional circuit within the respective regions of the subset of temperature sensors, wherein the operating mode includes one or more indications of an activity level of the functional circuit; and
      in response to a determination that the particular temperature estimate satisfies a threshold value, adjust the particular sample rate for subsequent temperature samples.

2. The apparatus of claim 1, wherein to determine whether the particular temperature estimate satisfies the threshold value, the control circuit is configured to use the particular temperature estimate to access a particular entry in a sample-rate table to select an adjusted sample rate, wherein the sample-rate table includes a plurality of sample rates mapped to a corresponding plurality of temperature estimates.

3. The apparatus of claim 2, wherein the integrated circuit includes a plurality of sample-rate tables; and
    wherein the control circuit is further configured to access a particular one of the plurality of sample-rate tables based on a type of the functional circuit that is within the respective regions of the subset of temperature sensor circuits.

4. The apparatus of claim 1, wherein the subset of the plurality of temperature sensor circuits is distributed among a plurality of functional circuits included within a particular processor core of a multicore processor included on the integrated circuit.

5. The apparatus of claim 4, wherein the particular temperature estimate is indicative of a temperature of the particular processor core.

6. The apparatus of claim 5, wherein the control circuit is further configured to:
    sample, using a different sample rate, respective temperature samples from a different subset of the plurality of temperature sensor circuits; and
    determine a different temperature estimate using one or more of the temperature samples of the different subset, wherein the different temperature estimate is indicative of a temperature of a different processor core.

7. The apparatus of claim 1, wherein to determine the particular temperature estimate, the control circuit is further configured to use a power estimate for the functional circuit within the respective regions, wherein the power estimate is based on a current workload of the functional circuit.

8. The apparatus of claim 1, wherein the control circuit is further configured to:
    track increases in a series of temperature estimates to determine when to increase the particular sample rate; and
    track decreases in the series of temperature estimates to determine when to decrease the particular sample rate.

9. The apparatus of claim 1, wherein to determine the particular temperature estimate, the control circuit is further configured to use a thermal conductivity value to estimate a difference between a given temperature sample and a temperature of the functional circuit in the respective regions.

10. A method comprising:
    sampling, using a particular sample rate, a subset of a plurality of temperature sensor circuits to generate a set of temperature samples, wherein the plurality of temperature sensor circuits is distributed across an integrated circuit;
    determining, using the set of temperature samples a particular temperature estimate indicative of a temperature of a particular functional circuit included on the integrated circuit;
    modifying the particular temperature estimate based on an operating mode of the particular functional circuit, wherein the operating mode includes one or more indications of an activity level of the particular functional circuit; and
    determining, based on a comparison of the particular temperature estimate to a threshold value, whether to adjust a sample rate for subsequent samples.

11. The method of claim 10, further comprising determining, using the set of temperature samples and an operating mode of a different functional circuit on the integrated circuit, a different temperature estimate indicative of a temperature of the different functional circuit.

12. The method of claim 11, wherein determining the particular and different temperature estimates includes using respective physical locations of the particular and different functional circuits in relation to the respective physical locations of the subset of temperature sensor circuits.

13. The method of claim 12, wherein using the respective physical locations includes using a thermal conductivity value to estimate differences between a given temperature sample and the respective temperatures of the particular and different functional circuits.

14. The method of claim 10, wherein the subset of the plurality of temperature sensor circuits is distributed among a plurality of functional circuits included within a particular processor core of a multicore processor included on the integrated circuit.

15. The method of claim 10, wherein determining the particular temperature estimate includes using a power estimate for the particular functional circuit, wherein the power estimate is based on a current workload of the particular functional circuit.

16. A system comprising:
    an integrated circuit including:
        a plurality of processor cores;
        a plurality of temperature sensor circuits distributed among the processor cores; and
        a control circuit; and
    a management circuit configured to adjust an operating parameter of one or more of the processor cores using a temperature estimate received from the integrated circuit;
    wherein the control circuit configured to:
        collect temperature samples from a particular subset of the temperature sensor circuits using a first sample rate, wherein the particular subset includes temperature sensor circuits associated with a particular one of the processor cores;
        determine a particular temperature estimate using the collected temperature samples from the particular subset of temperature sensor circuits;
        adjust the particular temperature estimate based on an operating mode of the particular processor core, wherein the operating mode includes one or more indications of an activity level of the particular processor core;
        send the particular temperature estimate and an identifier for the particular processor core to the management circuit; and
        determine, based on a comparison of the particular temperature estimate to a threshold value, whether to select a second sample rate for collecting subsequent temperature samples.

17. The system of claim 16, wherein the control circuit is further configured to:
    determine, using temperature samples collected from a different subset of temperature sensor circuits associated with a different one of the plurality of processor cores, a different temperature estimate indicative of a temperature of the different processor core; and
    send the different temperature estimate and an identifier for the different processor core to the management circuit.

18. The system of claim 17, wherein the management circuit is further configured to:

select, using the particular temperature estimate, a particular set of operating parameters for the particular processor core; and select, using the different temperature estimate, a different set of operating parameters for the different processor core.

19. The system of claim 16, wherein the control circuit is further configured to:

track increases in a first series of temperature samples from a first subset of temperature sensor circuits to determine when to increase a sample rate for the first subset of temperature sensor circuits; and concurrently track decreases in a second series of temperature samples from a second subset of temperature sensor circuits to determine when to decrease a sample rate for the second subset of temperature sensor circuits.

20. The system of claim 19, wherein the control circuit is further configured to:

determine the sample rate for the first subset of temperature sensor circuits using a first sample-rate table; and determine the sample rate for the second subset of temperature sensor circuits using a second sample-rate table, different from the first sample-rate table.

* * * * *